(12) United States Patent
Chen et al.

(10) Patent No.: US 11,848,551 B2
(45) Date of Patent: Dec. 19, 2023

(54) OVER-CURRENT PROTECTION CIRCUIT, DRIVING METHOD FOR OVER-CURRENT PROTECTION CIRCUIT AND DISPLAY DEVICE

(71) Applicants: HKC CORPORATION LIMITED, Shenzhen (CN); CHONGQING HKC OPTOELECTRONICS TECHNOLOGY CO., LTD., Chongqing (CN)

(72) Inventors: Wei Chen, Chongqing (CN); Chongwei Tang, Chongqing (CN); Yubo Gu, Chongqing (CN)

(73) Assignees: HKC CORPORATION LIMITED, Shenzhen (CN); CHONGQING HKC OPTOELECTRONICS TECHNOLOGY CO., LTD, Chongqing (CN)

( * ) Notice: Subject to any disclaimer, the term of this patent is extended or adjusted under 35 U.S.C. 154(b) by 269 days.

(21) Appl. No.: 17/613,499

(22) PCT Filed: Jun. 1, 2020

(86) PCT No.: PCT/CN2020/093711
§ 371 (c)(1),
(2) Date: Nov. 23, 2021

(87) PCT Pub. No.: WO2020/248856
PCT Pub. Date: Dec. 17, 2020

(65) Prior Publication Data
US 2022/0247164 A1    Aug. 4, 2022

(30) Foreign Application Priority Data
Jun. 10, 2019    (CN) .......................... 201910497226.X (51) Int. Cl.
*H02H 3/08*    (2006.01)
*G01R 19/165*    (2006.01)
(Continued)

(52) U.S. Cl.
CPC ............. *H02H 3/08* (2013.01); *G01R 19/165* (2013.01); *G09G 3/32* (2013.01); *H02H 9/02* (2013.01); *G09G 2330/04* (2013.01)

(58) Field of Classification Search
CPC .......... H02H 3/08; H02H 9/02; G01R 19/165; G09G 3/32; G09G 2330/04
See application file for complete search history.

(56) References Cited

U.S. PATENT DOCUMENTS 10,935,823 B2*   3/2021   Lee ..................... G02F 1/13452
2019/0028103 A1*  1/2019   Zhang ................. H02H 3/0935
(Continued)

FOREIGN PATENT DOCUMENTS

CN    105790206 A    7/2016
CN    109659921 A    4/2019

OTHER PUBLICATIONS

Beibei Han, the ISA written comments, Sep. 2020, CN.
Beibei Han, the International Search Report, dated Sep. 2020, CN.

*Primary Examiner* — Adolf D Berhane (57) ABSTRACT

The present application discloses an over-current protection circuit, a driving method for the over-current protection circuit and a display device. The over-current protection circuit includes a detection circuit, a first protection branch and a comparison circuit; where the detection circuit detects the current of a preset detection point in real time and obtains a detection voltage based on the current passing through the detection point; the first protection branch includes a delayer which delays the detection voltage obtained by the detection circuit for a preset time and then
(Continued)

outputs a first reference voltage; and the comparison circuit compares the detection voltage with the first reference voltage.

18 Claims, 4 Drawing Sheets

(51) Int. Cl.
*G09G 3/32* (2016.01)
*H02H 9/02* (2006.01)

(56) References Cited

U.S. PATENT DOCUMENTS

2021/0183289 A1* 6/2021 Kang .................... G09G 3/2092
2023/0317013 A1* 10/2023 Lee ....................... G09G 3/3258
　　　　　　　　　　　　　　　　　　　345/87

* cited by examiner

| Detecting the current of scanning lines in real time and obtaining a detection voltage based on the current of the scanning lines | S71 |

↓

| Delaying the detection voltage for a preset time, then operating to obtain a first reference voltage through an operator | S72 |

↓

| Comparing the first reference voltage with the detection voltage in real time, and cutting off the current output of the scanning lines when the detection voltage is higher than or equal to the first reference voltage | S73 |

OVER-CURRENT PROTECTION CIRCUIT, DRIVING METHOD FOR OVER-CURRENT PROTECTION CIRCUIT AND DISPLAY DEVICE

The present application claims the priority to the Chinese Patent Application No. CN201910497226.X, filed to the National Intellectual Property Administration, PRC on Jun. 10, 2019, and entitled "OVER-CURRENT PROTECTION CIRCUIT, DRIVING METHOD FOR OVER-CURRENT PROTECTION CIRCUIT AND DISPLAY DEVICE", which is incorporated herein by reference in its entirety.

TECHNICAL FIELD

The present application relates to the technical field of display, particularly to an over-current protection circuit, a driving method for the over-current protection circuit and a display device.

BACKGROUND

It should be understood that the statements herein merely provide background information related to the present application and do not necessarily constitute the conventional art.

The gate electrode voltage of each row of thin film transistors in a display device may be provided by a Gate Driver on Array (GOA) circuit. In the GOA circuit, a Level Shifter is generally configured to generate a clock control signal to control each row of thin film transistors to be turned on or off. During manufacturing process of the display device, if the sealant of the display device is not sealed tightly, a short circuit occurs easily between GOA circuits in the display device, as a result, a high current signal is generated, and an Over Current Protection (OCP) circuit is turned on to turn off the level shifter so as to prevent the display device from being burned out. If the short circuit point is in a low impedance short circuit, the current will be very high, and the circuit will be triggered easily to turn off the level converter over-current protection, so it is very difficult to set an accurate protection point when setting the circuit to turn off the level converter protection current; if the protection point is set too high, the short-circuited display device may be missed and the display device may be melted down rapidly.

How to prevent the situation that the current value resulting from short circuit is not too large at the beginning but increases over time to the extent of melting down the display device as it increases over time has become a concern in the industry.

SUMMARY

The purpose of the present application is to provide an over-current protection circuit, a driving method for the over-current protection circuit and a display device, so as to detect that the circuit is cut off due to a wrong determination for a slight short circuit.

The present application discloses an over-current protection circuit, including a detection circuit, a first protection branch and a comparison circuit, where the detection circuit detects the current of a preset detection point in real time and obtains a detection voltage based on the current passing through the detection point; the first protection branch includes a first switch element and a delayer, where the delayer delays the detection voltage obtained by the detection circuit for a preset time and then outputs a first reference voltage $V_{r1}$; the comparison circuit compares the detection voltage with the first reference voltage $V_{r1}$, and the first switch element cuts off the current output of the detection point when the detection voltage is higher than or equal to the first reference voltage $V_{r1}$.

The present application further discloses a driving method for the over-current protection circuit, including steps of:

detecting the current of a detection point in real time and obtaining a detection voltage based on the current of the detection point;

operating to obtain a first reference voltage $V_{r1}$ after delaying the detection voltage for a preset time; and comparing the first reference voltage $V_{r1}$ with the detection voltage in real time, and cutting off the current output of the detection point when the detection voltage is higher than or equal to the first reference voltage $V_{r1}$.

The present application further discloses a display device, including an over-current protection circuit and a drive circuit, where the over-current protection circuit includes:

a detection circuit and a first protection branch, where the detection circuit detects the current of a preset detection point in real time and obtains a detection voltage based on the current passing through the detection point; and the first protection branch includes a delayer and a comparison circuit; where the delayer delays the detection voltage obtained by the detection circuit for a preset time and then outputs a first reference voltage $V_{r1}$, and the comparison circuit compares the detection voltage with the first reference voltage $V_{r1}$, and cuts off the current output of the detection point when the detection voltage is higher than or equal to the first reference voltage $V_{r1}$.

The detection point of the detection circuit in the present application acquires real-time working current at the output terminal of scanning lines and outputs the corresponding detection voltage, while the first protection branch takes the detection voltage reflecting the working current of the display panel in normal work as the standard of reference thresholds through the delayer, delays the detection voltage for a preset time and outputs the detection voltage to obtain the first reference voltage which is compared with detection voltage corresponding to the working current of the detection point continuously obtained subsequently. The delayed detection voltage corresponding to the real-time working current at the output terminal of the scanning lines is taken as the standard of reference thresholds for comparison, the comparison standard is closer to the real working current of the display panel and fluctuates over time, so that over-current protection is more accurate. However, for different display panels, the normal working current may be different, and compared with an over-current protection circuit that sets only a fixed threshold as the comparison standard, it is less likely that the fixed threshold is too high or too low, and that a missed determination or a wrong determination occurs.

BRIEF DESCRIPTION OF DRAWINGS

The accompanying drawings, which are included to provide a further understanding of embodiments of the present application and constitute a part of the specification, illustrate embodiments of the application and, together with the text description, explain the principles of the application. Obviously, the drawings in the following description are merely some embodiments of the present application, and those skilled in the art can obtain other drawings according to the drawings without any inventive labor. In the drawings.

DETAILED DESCRIPTION OF EMBODIMENTS

It should be understood that the terminology, specific structural and functional details disclosed are merely exemplary for the purpose of describing specific embodiments. However, the present application may be embodied in many alternative forms and should not be construed as being limited to the embodiments set forth herein.

In the description of the present application, the terms "first" and "second" are only for the purpose of description and cannot be construed as indicating or implying relative importance or implicitly indicating the number of technical features indicated. Therefore, unless otherwise stated, a feature defined as "first" and "second" may explicitly or implicitly include one or more of the features; "multiple" means two or more. The term "include" and any variations thereof are intended to be inclusive in a non-closed manner, that is, the presence or addition of one or more other features, integers, steps, operations, units, components and/or combinations thereof may be possible.

In addition, the terms "center", "horizontally", "up", "down", "left", "right", "vertical", "horizontal", "top", "bottom", "inner", "outer" and the like for indicating an orientation or positional relationship are based on the description of the orientation or relative positional relationship shown in the accompanying drawings, and are only simplified description facilitating description of the application, and are not intended to indicate that the device or element referred to must have a particular orientation, be configured and operated in a particular orientation, and therefore cannot be construed as limiting the present application.

In addition, unless expressly specified and defined otherwise, the terms "mount", "attach" and "connect" are to be understood broadly, for example, it can be a fixed connection, a detachable connection, or an integral connection; it can be an either mechanical connection or an electrical connection; it can be a direct connection or an indirect connection through an intermediate medium, or an internal connection between two elements. For those skilled in the art, the specific meaning of the above terms in this application can be understood according to the specific circumstances.

The present application will now be described in details by reference to the accompanying drawings and optional embodiments.

Figure 1:
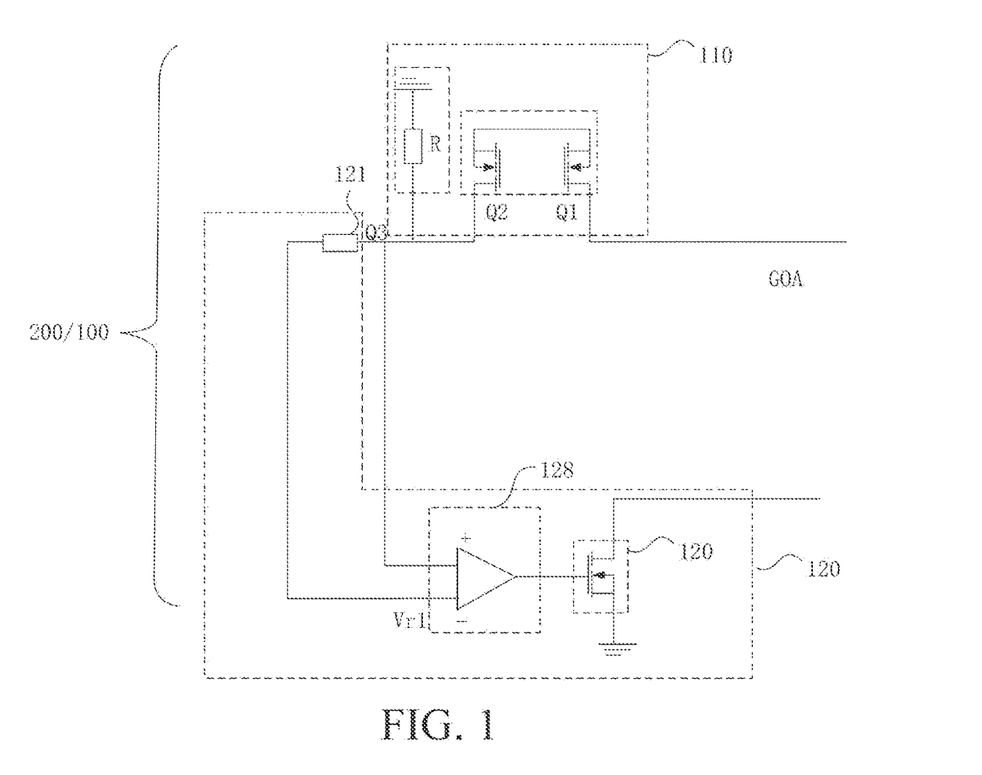
FIG. 1 is a circuit diagram of a scanning line according to an embodiment of the present application.

As shown in FIG. 1, an embodiment of the present application discloses a display device 200, including an over-current protection circuit 100 including a detection circuit 110, a first protection branch 120 and a comparison circuit 128, where the detection circuit 110 detects the current of a preset detection point Q3 in real time and obtains a detection voltage 111 based on the current passing through the detection point Q3; the first protection branch 120 includes a delayer 121 delaying the detection voltage 111 obtained by the detection circuit 110 for a preset time and then outputting a first reference voltage $V_{r1}$; the comparison circuit 128 compares the detection voltage 111 with the first reference voltage $V_{r1}$, and cuts off the current output of the detection point Q3 when the detection voltage 111 is higher than or equal to the first reference voltage $V_{r1}$. The detection voltage 111 is compared with the first reference voltage. When the detection voltage 111 is higher than or equal to the first reference voltage, the first protection branch 120 cuts off the scanning line circuit; and when the detection voltage 111 is lower than the first reference voltage, the first protection branch 120 does not work, and not only the scanning line circuit but also a GOA circuit is normally turned on.

If the short circuit point is in a low impedance short circuit, the current will be very high, and the over-current protection circuit 100 will be triggered, but there is often impedance at the short circuit point after the short circuit occurs, which causes that the current value is not too large at the beginning but increases over time to the extent of melting down the display device as it increases over time. The detection point Q3 of the detection circuit acquires real-time working current at the output terminal of scanning lines and outputs the corresponding detection voltage, while the first protection branch takes the detection voltage reflecting the working current of the display panel in normal work as the standard of reference thresholds through the delayer, delays the detection voltage for a preset time and outputs the detection voltage to obtain the first reference voltage $V_{r1}$ which is compared with detection voltage corresponding to the working current of the detection point Q3 continuously obtained subsequently. The delayed detection voltage corresponding to the real-time working current at the output terminal of the scanning lines is taken as the standard of reference thresholds for comparison, the comparison standard is closer to the real working current of the display panel and fluctuates over time, so that over-current protection is more accurate. However, for different display panels, the normal working current may be different, and compared with an over-current protection circuit that sets only a fixed threshold as the comparison standard, it is less likely that the fixed threshold is too high or too low, and that a missed determination or a wrong determination occurs.

Figure 2:
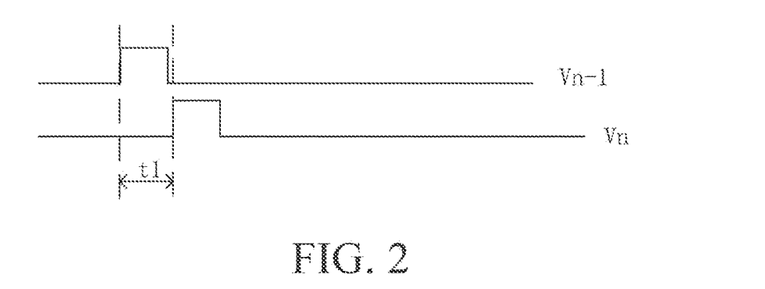
FIG. 2 is a circuit diagram illustrating turn-on time of a scanning line according to an embodiment of the present application.

As shown in FIG. 2, the preset time can be set as required, for example, the preset time can be set equal to the time $t_1$ for starting a row of scanning lines. With the first reference current obtained through the gate electrode turn-on time of the preset row of scanning lines, the working current of the previous row of scanning lines, as the reference current, is closer to the real working current, so that the reference value is high. With a short preset time, a short detection period, accurate detection and sensitive detection, changes in short-circuited voltage and current in a short time can be detected.

Figure 3:
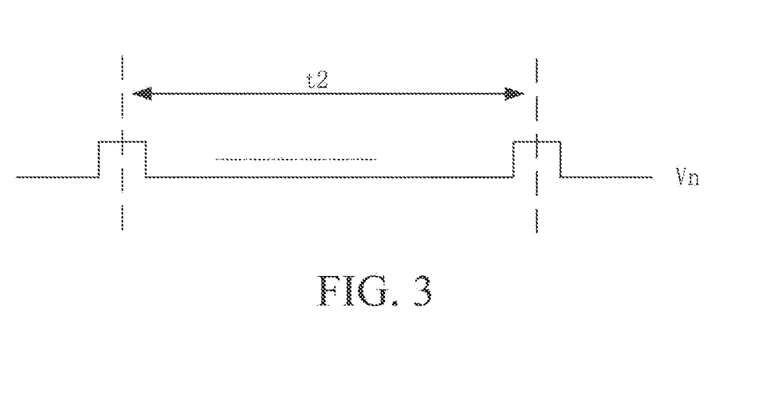
FIG. 3 is a circuit diagram illustrating turn-on time of a scanning line according to an embodiment of the present application.

The preset time can be set equal to one frame interval $t_2$. As shown in FIG. 3, the working current of one frame on the same scanning line is configured as the current first reference current, so that the reference value is higher, and since the difference in normal working current of different scanning lines may be greater and the fluctuation in the current of the same scanning line in work is smaller, the value of being the reference current is higher, so that the detection is more accurate. The preset time can also be set between $t_1$ and $t_2$, so that the detection sensitivity and detection accuracy can be improved.

Specifically, the first protection branch 120 may include a first switch element, and the comparison circuit 128 is a first comparator; the first comparator is a first voltage comparator 123, the first switch element is a first field effect transistor 124, a non-inverting input terminal of the first voltage comparator 123 receives the detection voltage 111, an inverting input terminal of the first voltage comparator 123 receives the first reference voltage, the first voltage comparator 123 compares the detection voltage 111 with the first reference voltage $V_{r1}$, the output terminal of the first voltage comparator 123 is electrically connected with a gate electrode of the first field effect transistor 124, a source electrode of the first transistor is electrically connected with an input terminal of the over-current protection circuit 100, and a drain electrode of the first field effect transistor 124 is grounded. When the detection voltage 111 is lower than the first reference voltage $V_{r1}$, the first comparator outputs a low level, the first field effect transistor 124 is turned off, and the first protection branch 120 does not work; and when the detection voltage 111 is higher than or equal to the first reference voltage $V_{r1}$, the first comparator outputs a low level, the first field effect transistor 124 is turned on, and the scanning line circuit is cut off.

Specifically, the first field effect transistor 124 may be an NMOS transistor. When the detection voltage 111 is lower than the first reference voltage, the first voltage comparator 123 generates a low level 0, and the low level outputs 0 through the first output terminal, and the first field effect transistor 124 is turned off based on the low level 0 output by the first output terminal. On the contrary, the first voltage comparator 123 generates a high level 1, and the first field effect transistor 124 is turned on based on the high level 1 output by the first output terminal.

Moreover, the over-current circuit can be further provided with a second protection branch 130, where a detection voltage 111 is obtained by the detection circuit 110 based on the current at the output terminal, and the second protection branch 130 compares the detection voltage 111 with a preset second reference voltage $V_{r2}$. When the detection voltage 111 is lower than the preset second reference voltage $V_{r2}$, the second protection branch 130 is not turned on, so that the whole circuit outputs current outward, and the circuit works normally; and when the detection voltage 111 is higher than or equal to the preset second reference voltage $V_{r2}$, the second protection branch 130 is turned on, and the circuit is turned off.

Specifically, the second protection branch 130 further includes a second voltage comparator 132 and a second field effect transistor 133; a non-inverting input terminal of the second voltage comparator 132 receives the detection voltage 111, an inverting input terminal of the second voltage comparator 132 receives the preset second reference voltage $V_{r2}$, the second voltage comparator 132 compares the detection voltage 111 with the second reference voltage $V_{r2}$, the output terminal of the second voltage comparator 132 is electrically connected with the gate electrode of the second field effect transistor 133, the source electrode of the second transistor is electrically connected with the input terminal of the over-current protection circuit 100, and the drain electrode of the second field effect transistor 133 is grounded.

The voltage comparator can compare the two input voltages and output a high level or a low level based on the comparison result, specifically, when the voltage at the non-inverting input terminal ("+" input terminal) is higher than that at the inverting input terminal ("−" input terminal), the voltage comparator outputs a high level; and when the voltage at the "+" input terminal is lower than that at the "−" input terminal, the voltage comparator outputs a low level. The logic switch circuit includes a first field effect transistor, where the first field effect transistor is turned on when a gate electrode of the field effect transistor receives a high level, and turned off when the gate electrode receives a low level.

Specifically, the second field effect transistor 133 may be an NMOS transistor. When the detection voltage 111 is lower than the preset second reference voltage $V_2$, the second voltage comparator 132 generates a low level 0, and the low level outputs 0 through the second output terminal, and the second field effect transistor 133 is turned off based on the low level 0 output by the second output terminal. On the contrary, the second voltage comparator 132 generates a high level 1, and the second field effect transistor 133 is turned on based on the high level 1 output by the second output terminal.

Figure 6:
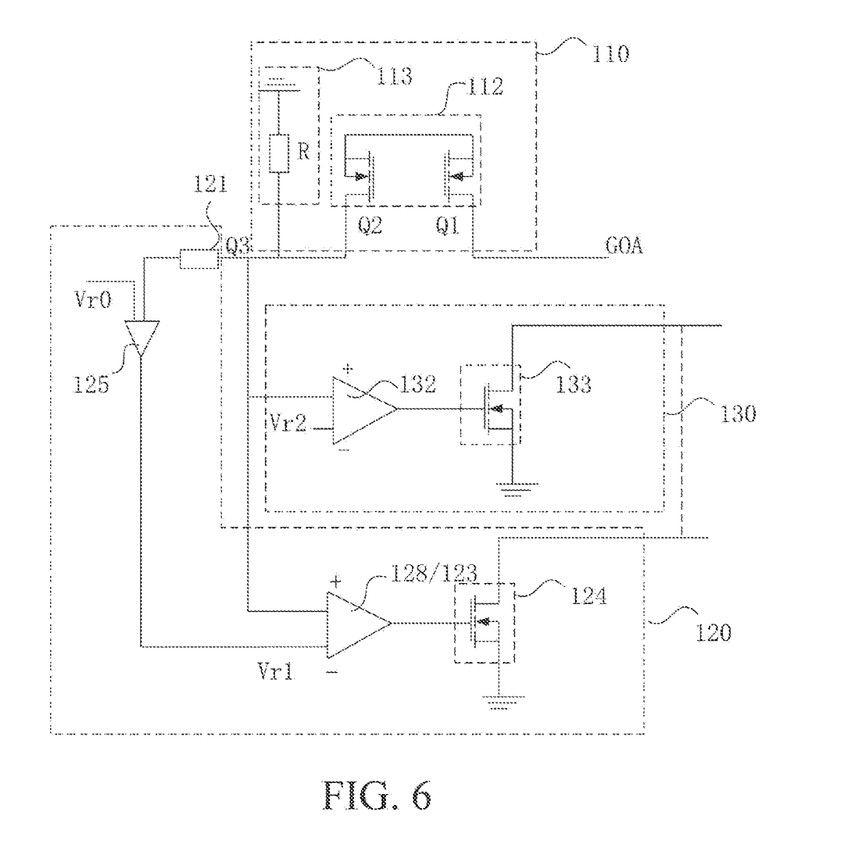
FIG. 6 is a circuit diagram of a scanning line according to another embodiment of the present application.
Figure 8:
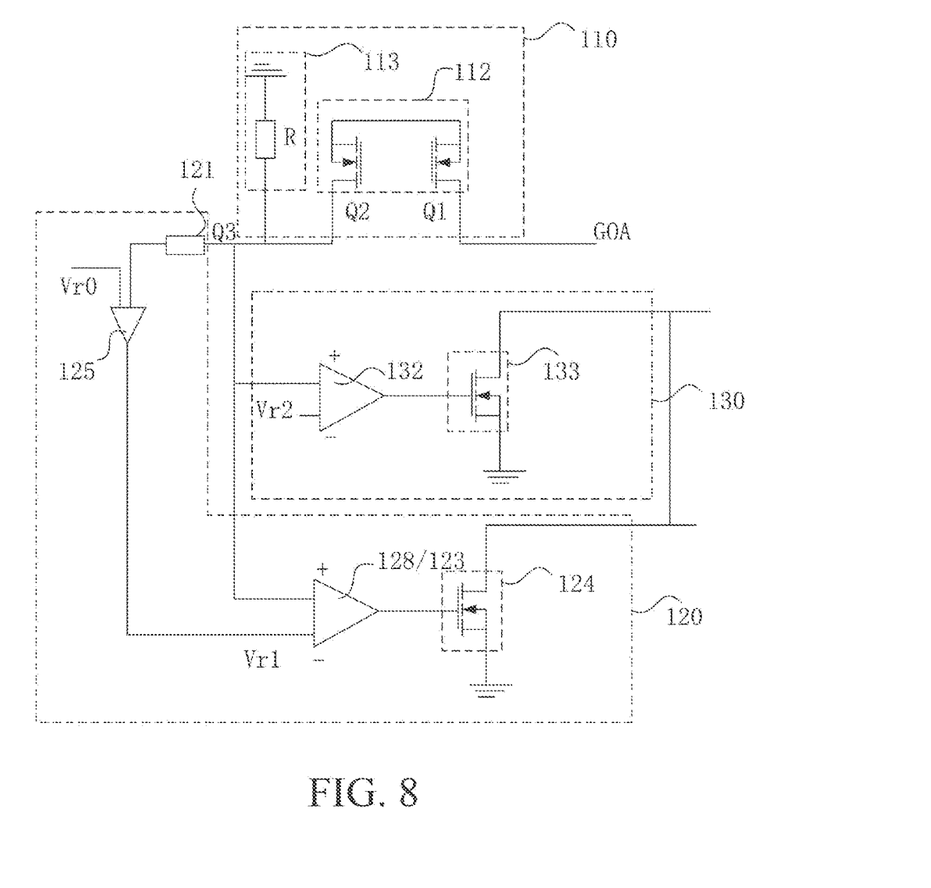
FIG. 8 is a circuit diagram of a scanning line according to another embodiment of the present application.

As shown in FIGS. 6 and 8, the second protection branch 130 can be electrically connected with the first protection branch 120, which is equivalent to a secondary protection circuit to detect minor short circuits with high detection accuracy, the current value is not too large at the beginning but increases over time to the extent of impairing the performance of the display device. The second protection branch 130 can not be connected with the first protection branch 120. The unconnected second protection branch and first protection branch provide separate protection, and the current scanning lines are cut off when one of the voltage comparator outputs a high level, so that the detection accuracy is high.

Figure 4:
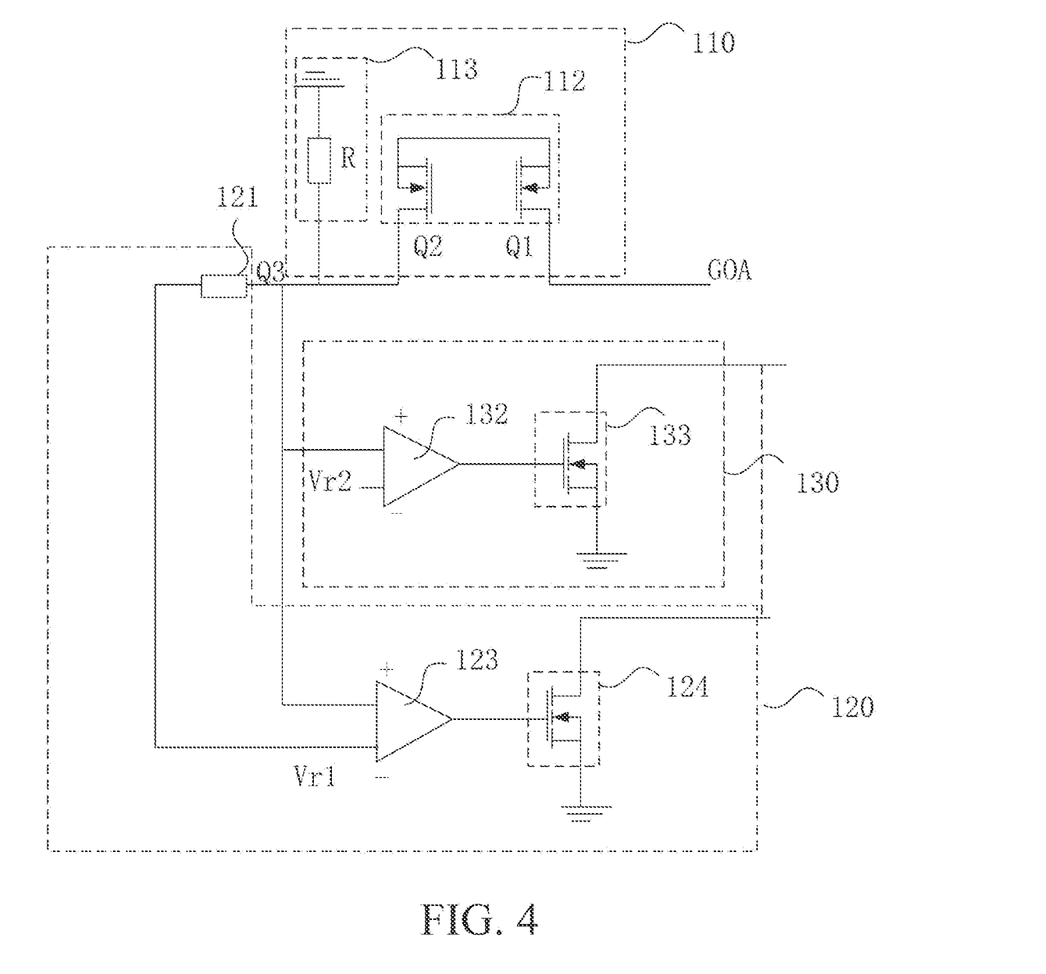
FIG. 4 is a circuit diagram of a scanning line according to another embodiment of the present application.

Generally, as shown in FIG. 4, in a GOA circuit, there may be fluctuation in the current of each row of scanning lines, and there may also be fluctuation in the detection voltage 111 detected by the corresponding detection circuit 110. In order to avoid normal fluctuation being determined as short circuits of the detection circuit 110, a threshold voltage $V_{th}$ can be set, the $V_{th}$ is greater than or equal to 0, the $V_{th}$ may be adjusted depending on the switching characteristics of different display devices. When the voltage of the detection circuit 110 is within the normal fluctuation range, the following conditions are satisfied: the sum of the detection voltage 111 of the previous frame and the $V_{th}$ is lower than the detection voltage 111 of the next frame, for example, the detection circuit 110 works normally when the detection voltage 111 is 40 V, and the fluctuation range is within 10 V, that is, the detection circuit 110 works normally when the detection voltage 111 is between 30 V and 50 V; if the detection voltage 111 of the previous frame is 40 V, the detection voltage 111 of the next frame is 49 V, and the detection voltage 111 of the next frame is lower than the sum of the detection voltage 111 of the previous frame and the $V_{th}$, the $V_{th}$ can be set to 10 V because of 49 V<40 V+10 V, the first voltage comparator 123 outputs a low level, the first protection branch 120 does not work, and 49 V is within the normal fluctuation range of the detection circuit 110; if the detection voltage 111 of the next frame is changed to 51 V, and 51 V is not within the normal fluctuation range of the detection circuit 110 because of 51 V>40V+10 V, the first voltage comparator 123 outputs a high level, the first protection branch 120 works, and the circuit is cut off.

If the voltage corresponding to the current of the current scanning lines is set as $V_n$, the upper limit of normal fluctuation in the $V_n$ is $V_{upper}$, and the lower limit is $V_{lower}$, then the upper limit of the corresponding voltage difference (voltage difference between wave crest and wave trough) in the normal fluctuation range of the current of the current scanning lines is $V_{normal}=V_{upper}-V_{lower}$; if the desired minimum short-circuit current detected when the current scanning lines are slightly short-circuited is $V_{short}$, then the lower limit of voltage difference between the voltage corresponding to the short-circuit current $V_{short}$ when the current scanning lines are slightly short-circuited and the voltage $V_n$ corresponding to the current of the current scanning lines is $V_{abnormal}$; $V_{short}=V_{abnormal}+V_n$; and the threshold $V_{th}$ of the first comparator satisfies the following condition:

$V_{upper}<V_n+V_{th}<V_{short}$, it can be concluded that:

$V_{normal}<V_{th}<V_{abnormal}$. Since the $V_{normal}$ and the $V_{abnormal}$ of different display devices are different, the corresponding threshold $V_{th}$ of the first comparator can be set based on the corresponding $V_{normal}$ and $V_{abnormal}$.

After the threshold is set, the first comparator detects that the detection voltage 111 is $V_n$ when the first protection branch 120 works for detection, and meanwhile, due to the role of the delayer 121, if the preset time delayed by the delayer 121 is a period of starting a scanning line, the first reference voltage is $V_{r1}=V_{n-1}$ when the $V_n$ is detected.

The $V_n$ and the $V_{r1}$ are compared and substituted into a determination formula of the first comparator: $V_n-V_{r1}<V_{th}$; when $V_n-V_{r1}<V_{th}$, the first comparator outputs a low level 0, the first effect transistor is turned off, and the scanning lines are kept on; if $V_n-V_{n-1}\geq V_{th}$, the first comparator outputs a high level 1, the first effect transistor is turned on, and the scanning line circuit is cut off.

When $V_{n-1}+V_{th}\leq V_{abnormal}$, the first comparator outputs a low level, the first protection branch 120 does not work, and the detection voltage 111 is determined to be within the normal fluctuation range, which is regarded as voltage increase resulting from short circuit, thereby avoiding the situation that the display device works badly due to wrong determination.

When $V_{n-1}+V_{th}\geq V_{abnormal}$, the first comparator outputs a high level, and the first protection branch 120 works, which is determined to be short circuit, so that the circuit is cut off.

Figure 5:
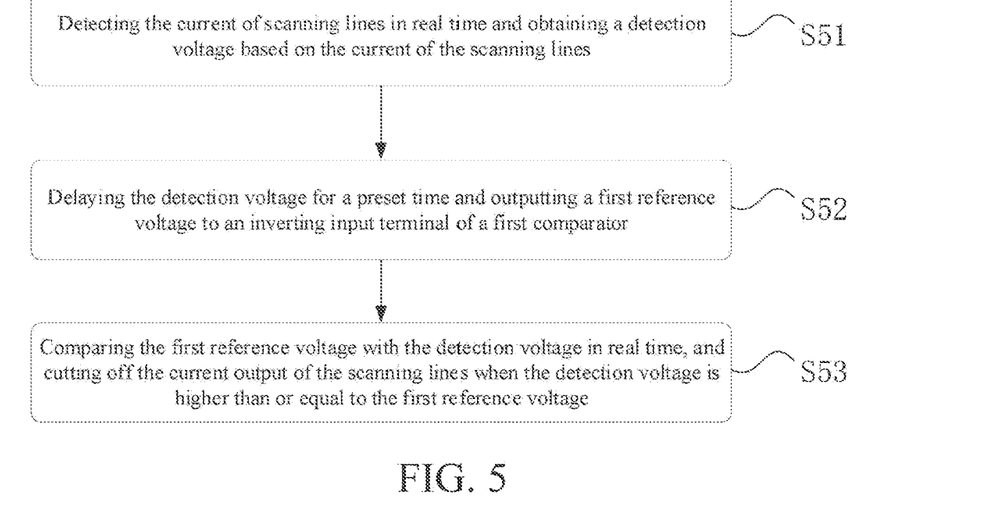
FIG. 5 shows steps of a driving method for an over-current protection circuit according to another embodiment of the present application.

Correspondingly, as shown in FIG. 5, a driving method for the over-current protection circuit 100 includes steps of:

S51: detecting the current of scanning lines in real time and obtaining a detection voltage based on the current of the scanning lines;

S52: delaying the detection voltage for a preset time and outputting a first reference voltage $V_{r1}$ to an inverting input terminal of a first comparator; and S53: comparing the first reference voltage $V_{r1}$ with the detection voltage in real time, and cutting off the current output of the scanning lines when the detection voltage is higher than or equal to the first reference voltage $V_{r1}$.

FIG. 6 shows another embodiment which differs from the above embodiment in that: the first protection branch 120 further includes an operator 125 including a first input terminal, a second input terminal and an output terminal, where the first input terminal receives the detection voltage 111 output by an output terminal of a delayer 121, the second input terminal receives the preset voltage $V_{r0}$, the operator 125 operates the detection voltage 111 and the preset voltage $V_{r0}$ to obtain the first reference voltage $V_{r1}$, and outputs the first reference voltage to an inverting input terminal of the first voltage comparator 123. When the detection voltage 111 is higher than or equal to the first reference voltage $V_{r1}$, the current output of the scanning lines is cut off, and when the detection voltage 111 is lower than the first reference voltage $V_{r1}$, the current of the scanning lines is turned on.

If the voltage corresponding to the current of the current scanning lines is set as $V_n$, the upper limit of normal fluctuation in the $V_n$ is $V_{upper}$, and the lower limit is $V_{lower}$, then the upper limit of the corresponding voltage difference in the normal fluctuation range of the current of the current scanning lines is $V_{normal}=V_{upper}-V_{lower}$; if the desired minimum short-circuit current detected when the current scanning lines are slightly short-circuited is $V_{short}$, then the lower limit of voltage difference between the voltage corresponding to the short-circuit current $V_{short}$ when the current scanning lines are slightly short-circuited and the voltage $V_n$ corresponding to the current of the current scanning lines is $V_{abnormal}$; $V_{short}=V_{abnormal}+V_n$; and the preset $V_{th}$ and the threshold $V_{th}$ of the first comparator satisfy the following condition:

$V_{upper}<V_{r0}+V_n+V_{th}\leq V_{short}$, it can be concluded that:

$V_{normal}<V_{r0}+V_{th}<V_{abnormal}$. Since the $V_{normal}$ and the $V_{abnormal}$ of different display devices are different, we can set the corresponding threshold $V_{th}$ of the first comparator and the corresponding $V_{r0}$ based on the corresponding $V_{normal}$ and $V_{abnormal}$.

For example, if the preset second reference voltage is set to 100 V, the output voltage of the detection circuit 110 is 40 V, the voltage output by the detection circuit 110, i.e., the detection voltage 111, is 40 V, at this moment, the second voltage comparator 132 outputs a low level, the second protection branch 130 does not work, and the circuit is not cut off. When the detection voltage 111 of the next frame becomes 70 V, the first reference voltage is calculated by the operator 125 from the detection voltage 111 of the previous frame (the preset voltage of the operator 125 is 20 V), that is, the first reference voltage is 43 V, at this moment, the detection voltage 111 is higher than the first reference voltage, the first comparator outputs a high level, and the first protection branch 120 works to cut off the detection circuit 110.

When the first protection branch 120 works for detection, the first comparator detects that the detection voltage 111 is $V_n$, and meanwhile, due to the role of the delayer 121, if the preset time delayed by the delayer 121 is a period of starting a scanning line, the first reference voltage is $V_{r1}=f(V_{r0}, V_{n-1})$ when the $V_n$ is detected (where the functional relationship can be additive operation or other operation algorithms, as long as a unique result can be obtained).

The $V_n$ and the $V_{r1}$ are compared and substituted into a determination formula of the first comparator: $V_n-V_{r1}<V_{th}$; the first comparator outputs low level 0, the first effect transistor is turned off, and the scanning lines are kept on; if $V_n-V_{r1}\geq V_{th}$, the first comparator outputs a high level 1, the first effect transistor is turned on, and the scanning line circuit is cut off.

When $V_{n-1}+V_{r0}+V_{th}\leq V_{abnormal}$, the first comparator outputs a low level, the first protection branch 120 does not work, and the detection voltage 111 is determined to be within the normal fluctuation range, which is regarded as voltage increase resulting from short circuit, so as to avoid poor work of the display device due to wrong determination.

When $V_{n-1}+V_{r0}+V_{th}\geq V_{abnormal}$, the first comparator outputs a high level, and the first protection branch 120 works, which is determined to be short circuit, so that the circuit is cut off.

The operator 125 is configured for introducing a Vr0 to perform the operation. With the introduction of the Vr0, the first comparator can choose a cheap device with a small threshold $V_{th}$, so that the choice of the first comparator is more and the cost is lower.

In a specific embodiment, if the preset second reference voltage is set to 100 V, the output voltage of the detection circuit 110 is 40 V, the voltage output by the detection circuit 110, i.e., the detection voltage 111, is 40 V, at this moment, the second voltage comparator 132 outputs a low level, the second protection branch 130 does not work, and the circuit is not cut off. When the detection voltage 111 of the next frame is 50 V, the first reference voltage is calculated by the operator 125 from the detection voltage 111 of the previous frame (if the operator 125 has a preset value $V_{r0}$=20 V, and $V_{th}$=10 V), that is, the first reference voltage is 44 V, at this moment, the detection voltage 111 is lower than the first reference voltage, plus $V_{th}$=10 V, the first comparator outputs a low level, the first protection branch 120 does not work, and the detection voltage 111 is determined within the normal fluctuation range, which is not regarded as voltage increase resulting from short circuit, thereby avoiding the situation that the display device works badly due to wrong determination.

In another specific embodiment, if the preset second reference voltage is set to 100 V, the output voltage of the detection circuit 110 is 40 V, the second voltage comparator 132 outputs a low level, the second protection branch 130 does not work, and the circuit is not cut off. When the detection voltage 111 of the next frame is 70 V, (if the operator 125 has a preset value $V_{r0}$=20 V and $V_{th}$=10 V), the first reference voltage is 44 V, the detection voltage 111 is higher than or equal to the first reference voltage $V_{r1}$, plus $V_{th}$=10 V, the first comparator outputs a high level, the first protection branch 120 works to cut off the circuit, while the second comparator outputs a low level, and the second protection branch 130 does not work, which causes that the influence caused by sudden current increase of the circuit cannot be effectively prevented, while the first protection branch 120 can effectively prevent circuit damage caused by setting the preset second reference voltage too high.

Figure 7:
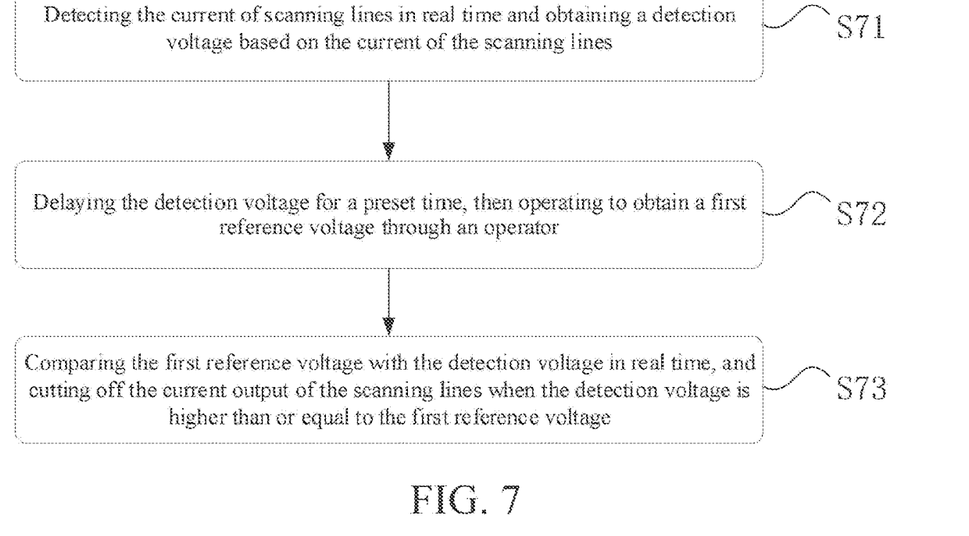
FIG. 7 shows steps of a driving method for an over-current protection circuit according to another embodiment of the present application.

Correspondingly, as shown in FIG. 7, a driving method for the over-current protection circuit 100 is disclosed, including steps of:

S71: detecting the current of scanning lines in real time and obtaining a detection voltage based on the current of the scanning lines;

S72: delaying the detection voltage for a preset time, then operating to obtain a first reference voltage $V_{r1}$ through an operator, and outputting the first reference voltage to an inverting input terminal of a first comparator; and S73: comparing the first reference voltage $V_{r1}$ with the detection voltage in real time, and cutting off the current output of the scanning lines when the detection voltage is higher than or equal to the first reference voltage $V_{r1}$.

Specifically, the detection circuit 110 includes a current detection circuit 112 and a current-to-voltage converter 113, where the current detection circuit 112 detects a current signal at an output terminal of the over-current protection circuit 100 and amplifies the current signal to obtain a valid current signal, and the current-to-voltage converter 113 receives and converts the valid current signal into a corresponding voltage signal.

The current detection circuit 112 may further include a third field effect transistor Q1 and a fourth field effect transistor Q2, where a gate electrode of the third field effect transistor Q1 is electrically connected with a gate electrode of the fourth field effect transistor Q2, a source electrode of the third field effect transistor Q1 is electrically connected with a source electrode of the fourth field effect transistor Q2, a drain electrode of the third field effect transistor Q1 is configured as an input terminal of the current detection circuit 112 to detect a current signal at the output terminal of the over-current protection circuit 100, and a drain electrode of the fourth field effect transistor is configured as an output terminal of the current detection circuit 112 to output the valid current signal.

It should be noted that, the limitation of the steps involved in this solution, without affecting the implementation of the specific solution, is not determined to limit the sequence of steps, and the previous steps may be executed first, later, or even simultaneously, and shall be deemed to fall within the scope of the present application as long as the solution can be implemented.

The technical solution of the present application can be widely applied to a variety of display panels, such as Twisted Nematic (TN) display panels, In-Plane Switching (IPS) display panels, Vertical Alignment (VA) display panels, Multi-Domain Vertical Alignment (MVA) display panels, and other types of display panels, such as Organic Light-Emitting Diode (OLED) display panels.

The above content is a further detailed description of the present application in conjunction with specific, optional embodiments, and it is not to be construed that specific embodiments of the present application are limited to these descriptions. For those of ordinary skill in the art to which this application belongs, a number of simple derivations or substitutions may be made without departing from the spirit of this application, all of which shall be deemed to fall within the scope of this application.

What is claimed is:

1. An over-current protection circuit, comprising:
  a detection circuit, detecting the current of a preset detection point in real time and obtaining a detection voltage based on the current passing through the detection point; and
  a first protection branch, comprising a first switch element;
  a delayer, delaying the detection voltage obtained by the detection circuit for a preset time and then outputting a first reference voltage $V_{r1}$; and
  a comparison circuit, comparing the detection voltage with the first reference voltage $V_{r1}$, wherein the first switch element cuts off the current output of the detection point when the detection voltage is higher than or equal to the first reference voltage $V_{r1}$.

2. The over-current protection circuit according to claim 1, wherein the preset time is equal to the time $t_1$ for turning on a row of scanning lines.

3. The over-current protection circuit according to claim 1, wherein the preset time is equal to one frame interval $t_2$.

4. The over-current protection circuit according to claim 1, wherein the first protection branch further comprises a first switch element, and the comparison circuit comprises a first comparator;
  a non-inverting input terminal of the first comparator receives the detection voltage;
  an inverting input terminal of the first comparator receives the first reference voltage;
  the first comparator compares the detection voltage with the first reference voltage, an output terminal of the first comparator is electrically connected with a control terminal of the first switch element, an input terminal of the first switch element is electrically connected with an input terminal of the over-current protection circuit, and an output terminal of the first switch element is grounded.

5. The over-current protection circuit according to claim 4, wherein the first protection branch further comprises an operator comprising a first input terminal, a second input terminal and an output terminal, wherein the first input terminal receives the detection voltage output through an output terminal of the delayer, and the second input terminal receives a preset voltage $V_{r0}$;

the operator operates the detection voltage and the preset voltage $V_{r0}$ to obtain the first reference voltage, and outputs the first reference voltage to the inverting input terminal of the first comparator;

current output of the detection point is cut off when the detection voltage is higher than or equal to the first reference voltage, and the current of the detection point is turned on when the detection voltage is lower than the first reference voltage.

6. The over-current protection circuit according to claim 5, wherein the preset time is equal to one frame interval $t_2$.

7. The over-current protection circuit according to claim 4, wherein the upper limit of the corresponding voltage difference in the normal fluctuation range of the current of current scanning lines is set as $V_{normal}$; and the lower limit of voltage difference between voltage corresponding to short-circuit current when the current scanning lines are slightly short-circuited and voltage corresponding to normal current is set as $V_{abnormal}$, then the preset voltage $V_{r0}$ and the threshold $V_{th}$ of the first comparator satisfy the following condition: $V_{normal} < V_{r0} + V_{th} < V_{abnormal}$.

8. The over-current protection circuit according to claim 7, wherein the threshold $V_{th}$ of the first comparator satisfies the following condition: $V_{normal} < V_{th} < V_{abnormal}$.

9. The over-current protection circuit according to claim 4, wherein the detection voltage is delayed by the delayer for a preset time and output to the inverting input terminal of the first comparator; the delayed output voltage is configured as the first reference voltage $V_{r1}$.

10. The over-current protection circuit according to claim 4, wherein the first switch element is a first field effect transistor, and the first field effect transistor is an NMOS transistor.

11. The over-current protection circuit according to claim 1, comprising a second protection branch comprising a second switch element, wherein the comparison circuit comprises a second comparator;

a non-inverting input terminal of the second comparator receives the detection voltage;

an inverting input terminal of the second comparator receives a preset second reference voltage;

the second comparator compares the detection voltage with the preset second reference voltage;

an output terminal of the second comparator is electrically connected with a gate electrode of the second switch element, a source electrode of the second switch element is electrically connected with the input terminal of the over-current protection circuit, and a drain electrode of the second switch element is grounded.

12. The over-current protection circuit according to claim 11, wherein the second switch element is a second field effect transistor, and the second field effect transistor is an NMOS transistor.

13. The over-current protection circuit according to claim 11, wherein the second protection branch is electrically connected with the first protection branch.

14. The over-current protection circuit according to claim 11, wherein the second protection branch is not electrically connected with the first protection branch.

15. The over-current protection circuit according to claim 1, wherein the detection circuit comprises a current detection circuit and a current-to-voltage converter, wherein the current detection circuit detects a current signal at an output terminal of the over-current protection circuit and amplifies the current signal to obtain a valid current signal, and the current-to-voltage converter receives and converts the valid current signal into a corresponding voltage signal.

16. The over-current protection circuit according to claim 15, wherein the current detection circuit further comprises a third field effect transistor and a fourth field effect transistor, wherein a gate electrode of the third field effect transistor is electrically connected with a gate electrode of the fourth field effect transistor, a source electrode of the third field effect transistor is electrically connected with a source electrode of the fourth field effect transistor, a drain electrode of the third field effect transistor is configured as an input terminal of the current detection circuit to detect a current signal at the output terminal of the over-current protection circuit, and a drain electrode of the fourth field effect transistor is configured as an output terminal of the current detection circuit to output the valid current signal.

17. A driving method for a over-current circuit protection, comprising steps of:

detecting the current of a detection point in real time and obtaining a detection voltage based on the current of the detection point;

operating to obtain a first reference voltage $V_{r1}$ after delaying the detection voltage for a preset time; and comparing the first reference voltage $V_{r1}$ with the detection voltage in real time, and cutting off the current output of the detection point when the detection voltage is higher than or equal to the first reference voltage $V_{r1}$.

18. A display device, comprising an over-current protection circuit and a drive circuit, wherein the over-current protection circuit comprises:

a detection circuit, detecting the current of a preset detection point in real time and obtaining a detection voltage based on the current passing through the detection point; and a first protection branch, comprising:

a delayer, delaying the detection voltage obtained by the detection circuit for a preset time and then outputting a first reference voltage $V_{r1}$; and a comparison circuit, comparing the detection voltage with the first reference voltage $V_{r1}$ and cutting off the current output of the detection point when the detection voltage is higher than or equal to the first reference voltage $V_{r1}$.

* * * * *